United States Patent [19]

Mizuno

[11] Patent Number: 5,058,500
[45] Date of Patent: Oct. 22, 1991

[54] APPARATUS AND PRINTING SYSTEM FOR DEVELOPING LITHOGRAPHIC PLATE FOR PRINTING AND MEASURING ITS IMAGE AREA RATES

[75] Inventor: Kenichi Mizuno, Ebina, Japan

[73] Assignee: Dai Nippon Insatsu Kabushiki Kaisha, Japan

[21] Appl. No.: 323,849

[22] Filed: Mar. 15, 1989

[30] Foreign Application Priority Data

| Mar. 15, 1988 | [JP] | Japan | 63-59337 |
| Mar. 15, 1988 | [JP] | Japan | 63-59338 |
| Sep. 14, 1988 | [JP] | Japan | 63-228442 |
| Sep. 14, 1988 | [JP] | Japan | 63-228443 |

[51] Int. Cl.$^5$ .............................. B41F 7/00; B41C 1/10
[52] U.S. Cl. .................... 101/142; 101/450.1; 101/463.1; 101/365; 101/DIG. 46
[58] Field of Search .............. 101/DIG. 47, DIG. 46, 101/DIG. 45, 484, 483, 450.1, 451, 452, 463.1, 365, 142; 355/27

[56] References Cited

U.S. PATENT DOCUMENTS

| Re. 27,613 | 4/1973 | Mignone | 101/463.1 X |
| 3,648,603 | 3/1972 | Kaminstein | 101/463.1 X |
| 4,649,502 | 3/1987 | Keller et al. | 101/365 X |
| 4,665,824 | 5/1987 | Greiner et al. | 101/DIG. 46 |

FOREIGN PATENT DOCUMENTS

| 3220360 | 12/1983 | Fed. Rep. of Germany | 101/365 |
| 95145 | 6/1984 | Japan | 101/DIG. 47 |
| 2121357 | 12/1983 | United Kingdom | 101/365 |

Primary Examiner—Clifford D. Crowder
Attorney, Agent, or Firm—Parkhurst, Wendel & Rossi

[57] ABSTRACT

On a lithographic plate for printing, there is provided an identification mark which indicates for which color the lithographic plate is and in which printing press the lithographic plate is to be used. The identification mark of the lithographic plate is simultaneously recorded when image area rates of the lithographic plate are measured. When the measured lithographic plate is mounted in the printing press, the data of image area rates which have already been measured and recorded are read utilizing the result of reading the identification mark. The data are transmitted to the printing press and used for control of the ink supply amount of the printing press. In order to carry the lithographic plate keeping a flat state, there is provided a difference between air pressure acted upon one surface and another surface of the lithographic plate. A locating apparatus is also used so that the lithographic plate is set at a correct measuring position in order to measure image rates of the lithographic plate. An image rate can be thereby correctly measured for each portion of the lithographic plate.

13 Claims, 7 Drawing Sheets

APPARATUS AND PRINTING SYSTEM FOR DEVELOPING LITHOGRAPHIC PLATE FOR PRINTING AND MEASURING ITS IMAGE AREA RATES

BACKGROUND OF THE INVENTION

1. Field of the Invention

This invention relates to an apparatus for developing a lithographic plate for printing and measuring image area rates and a printing system using the same, and more particularly, to a system for obtaining a measured result for every lithographic plate for printing and performing printing using the data of image area rates obtained by the measurement.

2. Description of the Prior Art

Figure 11:
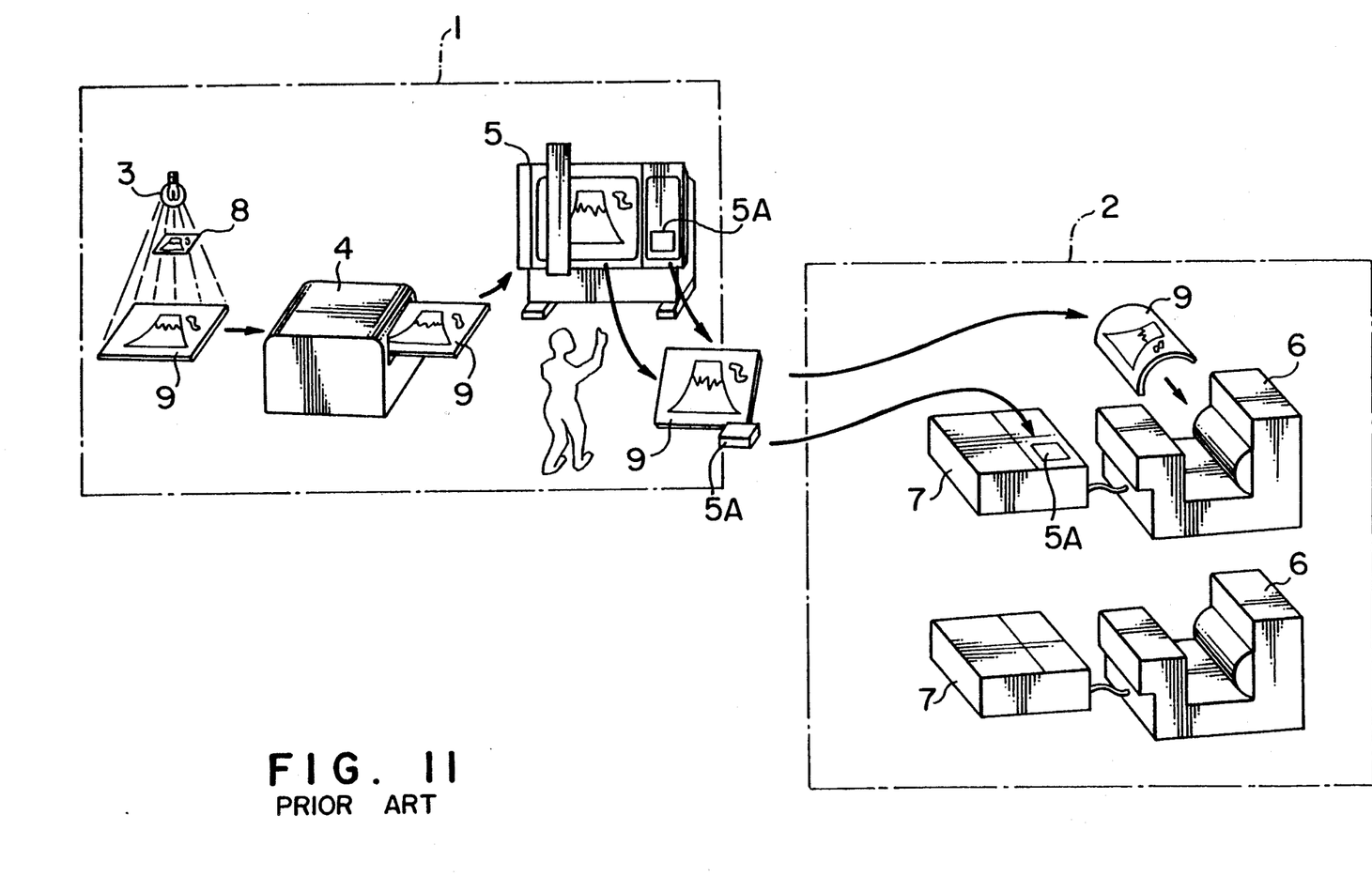
FIG. 11 is a model drawing showing a conventional example of a printing system.

In general, a printing system such as offset printing or the like comprises, for example, as shown in FIG. 11, a plate making room 1 and a printing factory 2. In the plate making room 1, there are provided a printing apparatus 3, a developing apparatus 4 and an image area rate measuring apparatus 5. In the printing factory, there are provided a printing press 6 and a control apparatus (a remote control desk) 7.

The printing apparatus 3 prints an image of an original picture film 8 on a lithographic plate 9, and the developing apparatus 4 develops and fixes the lithographic plate 9. The image area rate measuring apparatus 5 measures image area rates of the lithographic plate 9, and records measured data in a cassette magnetic tape (or other recording medium) 5A. The printing press 6 comprises a plate roller to which the lithographic plate 9 is mounted, an ink source roller for supplying ink to image portions of the lithographic plate 9 and an ink supply amount adjusting apparatus for adjusting an ink supply amount of each ink zone partitioned in the longitudinal direction of the ink source roller. The control apparatus 7 controls the ink supply amount adjusting apparatus of the printing press 6 according to the measured result recorded in the cassette magnetic tape 5A of the image area rate measuring apparatus 5.

That is, printing operation in the conventional printing system is as follows.

(1) The printed and developed lithographic plate 9 is temporarily kept or carried to the image area rate measuring apparatus 5 by manual operation of the operator or the like. Image area rates of the lithographic plate 9 are then measured by the image area rate measuring apparatus 5, and measured data are recorded in the cassette magnetic tape 5A.

(2) The lithographic plate 9 and the cassette magnetic tape 5A are temporarily kept or carried from the plate making room 1 to the printing factory 2 by manual operation of the operator or the like under a mutually nonseparable state. The lithographic plate 9 is then mounted in the printing press 9, and the cassette magnetic tape 5A is housed in the control apparatus 7.

(3) The control apparatus 7 controls the ink supply amount adjusting apparatus of the printing press 6 according to the recorded data of the cassette magnetic tape 5A, and printing is performed by the printing press 6.

However, in the conventional printing system described above, it is necessary to temporarily keep or carry from the plate making room 1 to the printing factory 2 by manual operation of the operator or the like the storage medium of image area rates such as the cassette magnetic tape 5A or the like in the above-described (2). It is also necessary to keep or carry under a state in which the lithographic plate 9 and the storage medium such as the cassette magnetic tape 5A or the like are not separated each other. These requirements hinder the simplification and speedup of the lithographic plate processing line in the printing system.

Moreover, in the conventional printing system described above, it is necessary to temporarily keep or carry the lithographic plate 9 from the developing apparatus 4 and the image area rate measuring apparatus 5 in the above-described (1). This requirement also hinders the simplification and speedup of the lithographic plate processing line in the printing system.

SUMMARY OF THE INVENTION

It is an object of the present invention to attempt the simplification and speedup of a lithographic plate processing line in a printing system, and improve the production efficiency thereof.

It is another object of the present invention to attempt the automation of locating and detection operations of a lithographic plate in an image area rate measuring apparatus, and improve the production efficiency thereof.

It is still another object of the present invention to reliably carry a thin plate without slip, by contacting only one surface of the thin plate with rotating carrying means.

Aspect 1

According to one aspect of the present invention, a printing system comprises a developing apparatus for developing and fixing a lithographic plate on which an image of an original picture film has been printed, an image area rate measuring apparatus for measuring image area rates of the lithographic plate developed by the developing apparatus and a carrying apparatus for automatically carrying the lithographic plate which has been developed and fixed by the developing apparatus from the developing apparatus to the image area rate measuring apparatus.

In the present invention, the developed lithographic plate is automatically carried by the carrying apparatus to the image area rate measuring apparatus, where image area rates are measured.

That is, in the present invention, it is not necessary to temporarily keep or carry by manual operation of the operator or the like the lithographic plate from the developing apparatus and the image area rate measuring apparatus.

Consequently, according to the present invention, it is possible to attempt the simplification and speedup of a lithographic plate processing line in a printing system, and improve the production efficiency thereof.

Aspect 2

According to another aspect of the present invention, a printing system comprises an image area rate measuring apparatus for measuring image area rates of a lithographic plate, a printing press comprising a plate roller to which the lithographic plate is mounted, an ink source roller for supplying ink to image portions of the lithographic plate and ink supply amount adjusting apparatus for adjusting an ink supply amount of each ink zone partitioned in the longitudinal direction of the ink source roller, and a control apparatus for controlling the ink supply amount adjusting apparatus of the printing press according to the measured result of the image area rate measuring apparatus. The image area rate measuring apparatus measures image area rates of the lithographic plate, and records the image area rates of the lithographic plate measured by the image area rate measuring apparatus in a storage device together with an identification mark attached to the lithographic plate. The control apparatus receives the image area rates of the lithographic plate corresponding to the identification mark based on the identification mark of the lithographic plate, and controls the ink supply amount adjusting apparatus based on the received result.

In the present invention, a printing system comprises a developing apparatus for developing and fixing a lithographic plate on which an image of an original picture film has been printed, an image area rate measuring apparatus for measuring image area rates of the lithographic plate developed by the developing apparatus, a printing press comprising a plate roller to which the lithographic plate is mounted, an ink source roller for supplying ink to image portions of the lithographic plate and an ink supply amount adjusting apparatus for adjusting an ink supply amount of each ink zone partitioned in the longitudinal direction of the ink source roller, and a control apparatus for controlling the ink supply amount adjusting apparatus of the printing press according to the measured result of the image area rate measuring apparatus. The lithographic plate developed and fixed by the developing apparatus is automatically carried from the developing apparatus to the image area rate measuring apparatus by a carrying apparatus. The image area rate measuring apparatus measures image area rates of the lithographic plate, and records the image area rates of the lithographic plate measured by the image area rate measuring apparatus in a storage device together with an identification mark attached to the lithographic plate. The control apparatus receives the image area rates of the lithographic plate corresponding to the identification mark of the lithographic plate based on the identification mark, and controls the ink supply amount adjusting apparatus of the printing press based on the received result.

In the present invention, measured data of image area rates of the lithographic plate by the image area rate measuring apparatus are recorded in the storage device together with the identification mark. Subsequently, the identification mark of the lithographic plate mounted in the printing press is read by the operator of the printing press or by a mark reader. The control apparatus which operates according to the result of the read draws the image area rates of the lithographic plate corresponding to the concerned identification mark from the storage device and controls the ink supply amount adjusting apparatus of the printing press, and thereby printing by the printing press is performed.

That is, in the present invention, measured data of the image area rate measuring apparatus installed in the plate making room or the like are online-transferred to the control apparatus installed in the printing factory or the like. Hence, it is not necessary to temporarily keep a storage medium of measured data before inputting into the control apparatus, or carry the storage medium by manual operation of the operator or the like. Moreover, since an identification mark is attached to the lithographic plate image area rates of which are to be measured, and the measured data and the identification mark thereof are recorded in a pair in a storage devices, it is possible to reliably and easily link the lithographic plate with the corresponding measured data by means of the identification mark, and thus handling of the lithographic plate and measured data becomes excellent.

Furthermore, in the present invention, the developed lithographic plate is automatically carried to the image area rate measuring apparatus by the carrying apparatus to measure image area rates.

That is, in the present invention, it is not necessary to temporarily keep or carry by manual operation of the operator or the like the lithographic plate between the developing apparatus and the image area rate measuring apparatus.

Hence, according to the present invention, it is possible to attempt the simplification and speedup of a lithographic plate processing line in a printing system, and improve the production efficiency thereof.

Aspect 3

According to another aspect of the present invention, in a carrying method of a thin plate in which the thin plate is mounted and carried on plural mutually-juxtaposed rotating carrying means, an atmospheric pressure surrounding a thin-plate carrying surface formed by the rotating carrying means is adjusted so that an atmospheric pressure acted upon a surface at the side opposite to the rotating carrying means is larger than an atmospheric pressure acted upon a surface at the side of the rotating carrying means.

In the present invention, in a thin-plate carrying apparatus for mounting and carrying a thin plate on plural mutually-juxtaposed rotating carrying means, air rooms which are nearly closed except an area of a thin-plate carrying surface formed by the rotating carrying means are provided outside the thin-film carrying surface, and atmospheric pressure adjusting means for controlling the atmospheric pressure within the air rooms are also provided so that an atmospheric pressure acted upon a surface at the side opposite to the rotating carrying means is larger than an atmospheric pressure acted upon a surface at the side of the rotating carrying means.

According to the present invention, the thin plate is pressed against the side of the rotating carrying means due to a difference between atmospheric pressures acted upon the surface at the side opposite to the rotating carrying means and the surface at the side of the rotating carrying means of the thin plate. The contact resistance between the thin plate and the rotating carrying means is thereby increased, and it is possible to reliably carry the thin plate without slip.

According to the present invention, due to the presence of the air rooms and atmospheric-pressure adjusting means, it is possible to reliably provide a constant pressure difference between the atmospheric pressure acted upon the surface at the side opposite to the rotating carrying means and the atmospheric pressure acted upon the surface at the side of the rotating carrying means of the thin plate, and reliably press the thin plate against the side of the rotating carrying means. The contact resistance between the thin plate and the rotating carrying means is thereby increased, and it is possible to reliably carry the thin plate without slip.

Aspect 4

According to another aspect of the present invention, an image area rate measuring apparatus comprising a lithographic plate supporting means for supporting a lithographic plate, and a detection head for detecting image area rates of the lithographic plate which is disposed having a specific positional relationship relative to the lithographic plate supporting means and supported by the lithographic plate supporting means, further comprises lithographic plate setting means for coinciding a locating standard member of the lithographic plate introduced in the lithographic plate supporting means with a standard setting member fixed in a supporting region of the lithographic plate supporting means, and control means for performing a driving control of the lithographic plate setting means and the detection head, and starting an image area rate detection operation by the detection head, on condition that the lithographic plate setting means has coincides with the locating standard member of the lithographic plate with the standard setting member of the lithographic plate supporting means.

According to the present invention, the lithographic plate introduced in the lithographic plate supporting means is (1) automatically located at a specific position of the lithographic plate supporting means by the lithographic plate setting means which is subject to driving control by the control means, and (2) subsequently, image area rates of the lithographic plate are measured by detection operation of the detection head, the operation of which is started by the control means.

That is, it is possible to attempt automation of the locating and detection operations of the lithographic plate in the image area rate measuring apparatus, and improve the production efficiency thereof.

DESCRIPTION OF THE PREFERRED EMBODIMENTS

Figure 1:
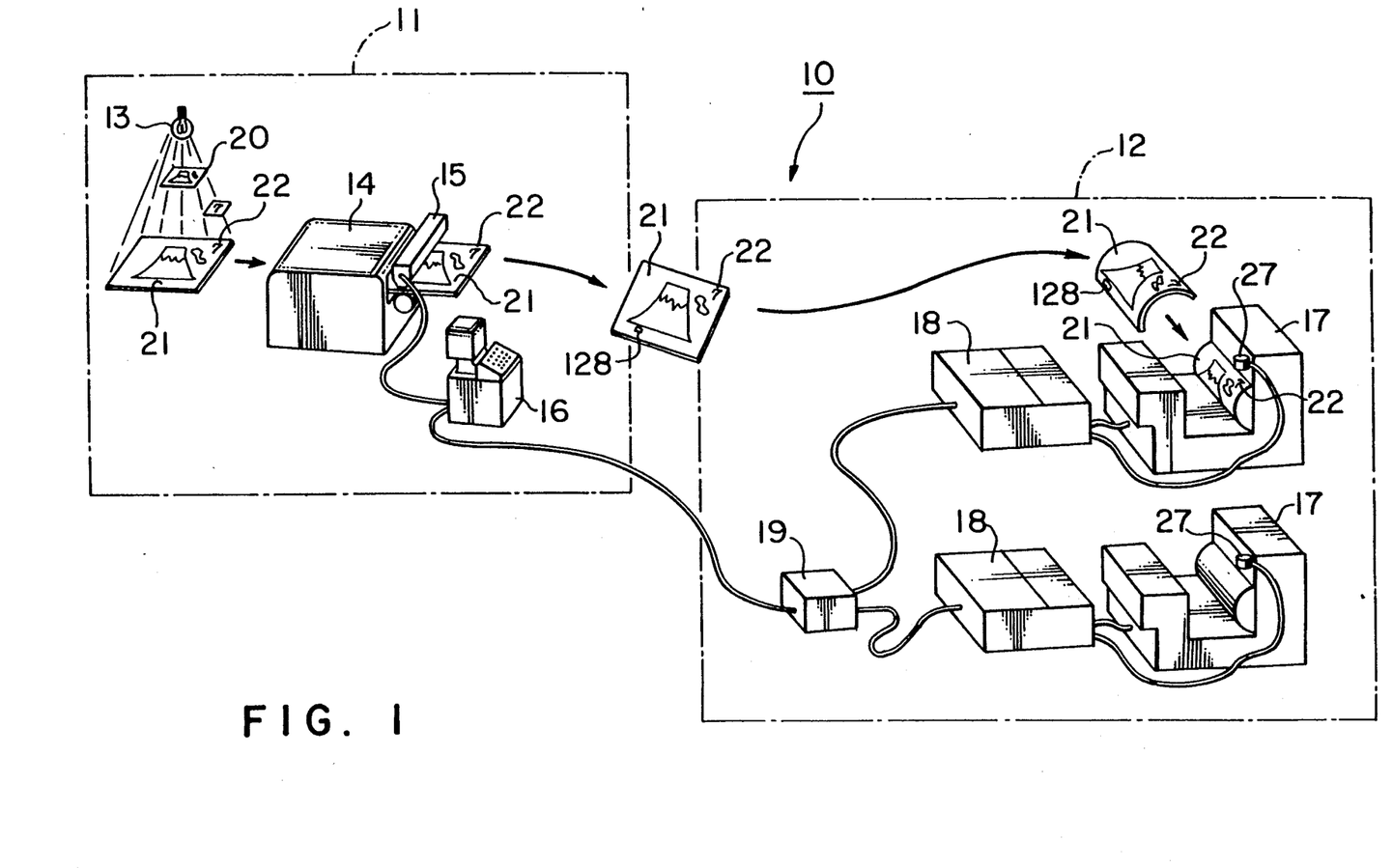
FIG. 1 is a model drawing showing an example of a printing system to which the present invention is applied.

As shown in FIG. 1, a printing system 10 comprises a plate making room 11 and a printing factory 12. In the plate making room 11, there are provided a printing apparatus 13, a developing apparatus 14, an image area rate measuring apparatus 15 and a storage device (a large-capacity memory data terminal) 16. In the printing factory 12, there are provided plural pairs of printing presses 17 and control apparatus (remote control desks) 18 and an intermediate terminal 19. The image area rate measuring apparatus 15 and the storage device 16, the storage device 16 and the intermediate terminal 19, the intermediate terminal 19 and each control apparatus 18, each control apparatus 18 and the corresponding printing press 17 are connected by signal lines, respectively.

The printing apparatus 13 prints an image of an original picture film 20 on a lithographic plate 21. At this time, the printing apparatus 13 attaches a calibration mark and a specific identification mark ("7" in the illustrated example) 22 which are used when measuring image area rates of the lithographic plate 21 on the lithographic plate 21. A bar code or the like may also be used as the identification mark.

Figure 2:
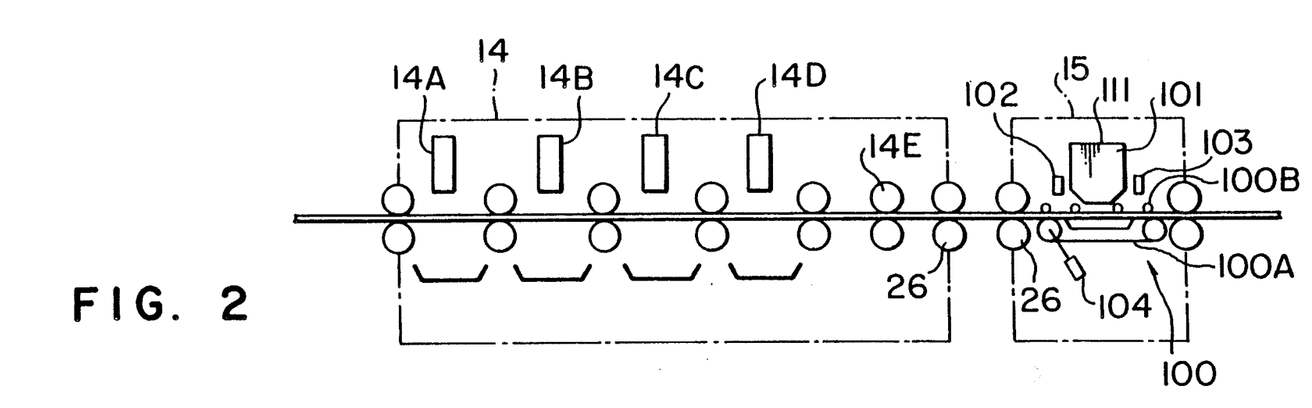
FIG. 2 is a model drawing showing a developing apparatus and an image area rate measuring apparatus.

The developing apparatus 14 develops and fixes the lithographic plate 21 on which the image of the original picture film 20 has been printed by the printing apparatus 13. The developing apparatus 14 comprises, for example, as shown in FIG. 2, a developer supply nozzle 14A, a washing nozzle 14B, a fixer supply nozzle 14C, a washing nozzle 14D and a drying roller 14E.

The image area rate measuring apparatus 15 measures the image area rates of effective image regions of the lithographic plate 21. The image area rate measuring apparatus 15 comprises, as shown in FIG. 2, a carrying apparatus 100, an optical detection head 101, an edge detection device 102 and a mark reader 103. While the lithographic plate 21 is moving, image area rates thereof are measured by the detection head 101. The carrying apparatus 100 comprises a suction belt 100A provided along the carrying direction of the lithographic plate 21 under the carrying surface thereof and a pressing roller 100B for pressing down an edge of the lithographic plate 21 which perpendicularly crosses with the carrying direction thereof from above. An encoder 104 is provided to the driving shaft of the suction belt 100A.

Figure 3A:
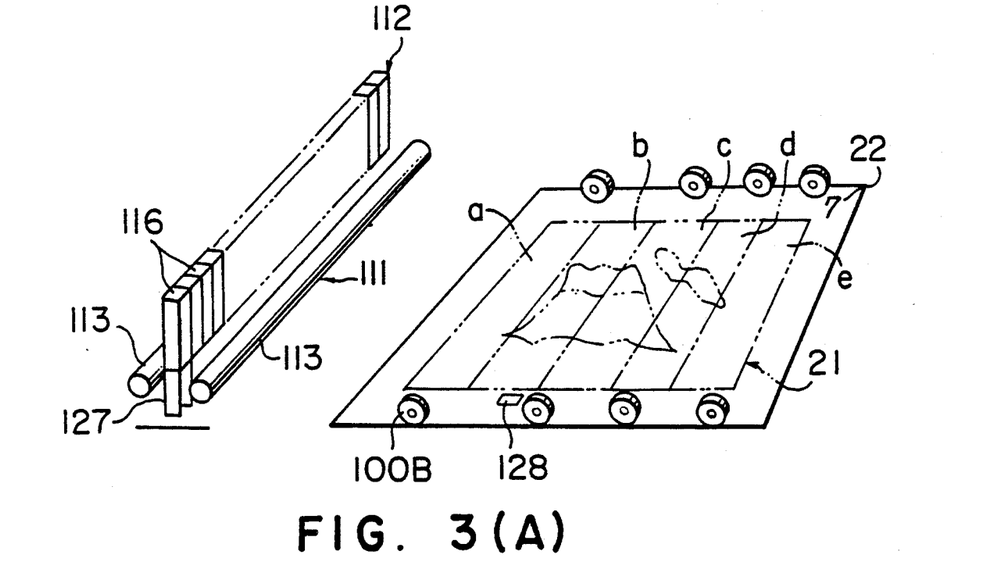
FIG. 3A is a model drawing showing an image area rate measuring apparatus.

The optical detection head 101 includes a box-like head casing 110, within which there are provided an illuminating optical system 111 and an optical detection device 112, as shown in FIG. 3(A) relative to its principle. The illuminating optical system 111 comprises two fluorescent lamps 113, 113 which are provided in parallel as filament-like illuminating sources. The fluorescent lamps 113, 113 are held by fixed holders (not illustrated) at near their end portions, and fixed to bottom portions at both sides of the casing 110.

Figure 3B:
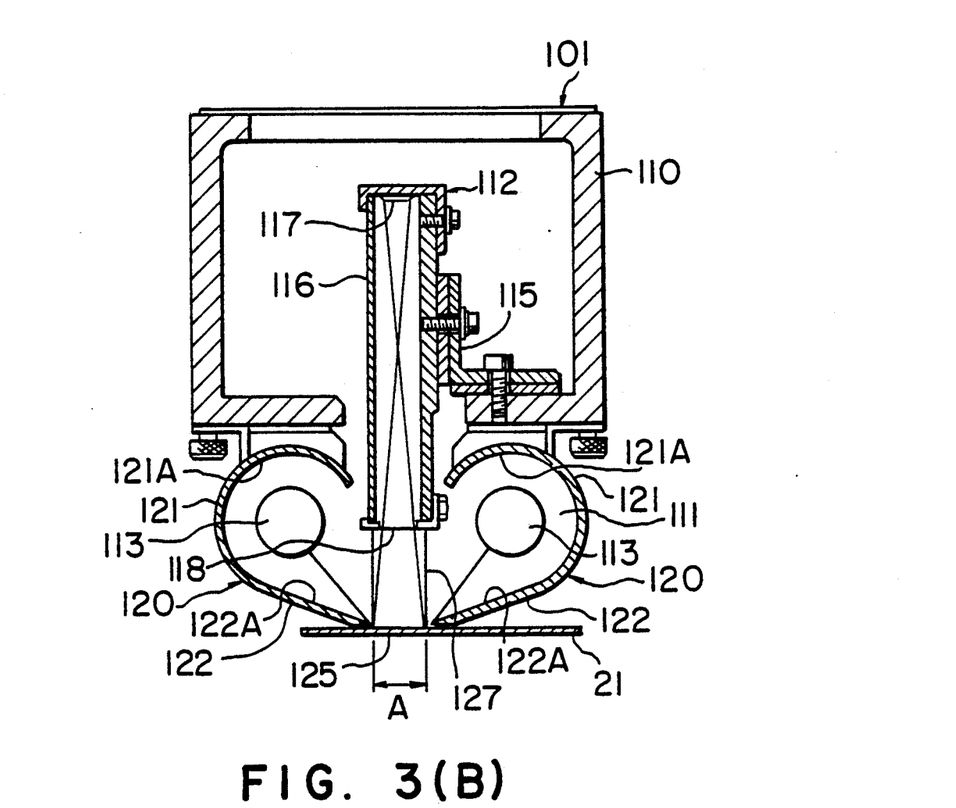
FIG. 3B is a cross-sectional view of a portion of the image area rate measuring apparatus.

The optical detection device 112 is provided at an upper position in an intermediate portion between both fluorescent lamps 113, 113, as shown in FIG. 3(B), fixed at the bottom wall of the casing 110 by a mounting fixture 115 having an L-like cross section, and is housed within the box-like casing 110. The optical detection device 112 comprises many light-tight boxes which are aligned in rows, and photosensors 117 such as photodiodes or the like as photodetectors mounted to the apexes of the light-tight boxes 116. The lower portions of the light-tight boxes 116 are open, and slits 118 are provided at the lower end openings. The fluorescent lamps 113 are provided at both sides of the lower end openings of the light-tight boxes 116.

The fluorescent lamps 113, 113 constituting the illuminating optical system 111 are covered by masks 120 at both external regions. The masks 120, 120 are mounted to lower portions of the casing 110, and comprise circular or elliptic curved portions 121 which cover the fluorescent lamps 113, 113 from outside, and rectilinear portions 122 which obliquely extend from external lower ends of the curved portions 121 toward the surface of the lithographic plate 21 or the table. The fluorescent lamps 113 are disposed at the center or the focal position of the curved portions 121 and are open to the surface side of the lithographic plate 21. The curved portions 121 are formed as reflecting surfaces 121A which reflect illuminating light from the fluorescent lamps 113. The rectilinear portions 122 of both masks 120 are painted in black, and formed as nonreflecting surfaces 122A for absorbing illuminating light from the fluorescent lamps 113 to prevent a bad influence due to reflection from the nonreflecting surfaces 122A. The regions of the nonreflecting surfaces 122A may be within a range capable of preventing the reflected light of the fluorescent lamps 113 from directly entering the light-tight boxes 116 of the optical detection device 112.

Both rectilinear portions 122, 122 of the masks 120 slant in directions gradually approaching each other toward the surface side of the lithographic plate, and are terminated near the surface of the lithographic plate 21, where a slender rectangular window member 125 is formed. The window member 125 extends in the longitudinal direction of the fluorescent lamps 113 in parallel, and is arranged so that the illuminating light from the fluorescent lamps 113 slit-expose the detection region A of the lithographic plate through the window member 125.

Light-tight plates 127 are mounted on both sides at positions between which a calibration mark 128 of the lithographic plate 21 passes.

The edge detection device 102, for which a proximity sensor or the like is used, detects that the front edge in the moving direction of the lithographic plate 21 passing through the developing apparatus 14 reaches the image area rate measuring apparatus 15. According to this detected signal and the value of the previously-described encoder 104, it is detected which region (a–e) is now facing the detection head 101 at the lithographic plate 21 in course of moving.

The mark reader 103, for which a well-known recognition device is used, reads the previously-described identification mark 22 ("7" in the illustrated example) printed on the lithographic plate 21.

In such image area rate measuring apparatus 15, the lithographic plate 21 sequentially passes under the detection head 101 being located by the suction belt 100A and the pressing roller 100B. The detection head 101 irradiates the illuminating light from both fluorescent lamps 113, 113 of the illuminating optical system 111 on the detection region A of the lithographic plate 21 through the rectangular window member 125 of the masks 120, and slit-exposes that region. By the slit exposure, the reflected light from the detection region A of the lithographic plate 21 passes through the slit 118, enters each light-tight box 116 of the optical detection device 112, and is received by the photosensor 117 such as a photodiode or the like as a photodetector provided at each apex of the light-tight boxes 116. An image area rate of the lithographic plate 21 is thus measured for each light-tight box 116 according to the magnitude of the reflected light. At this time, the reflected light from the calibration mark 128 is input into a predetermined photosensor 117 without receiving a bad influence from the surroundings due to the presence of the light-tight plates 127, and the calibration value can be correctly read by the photosensor 117. The calibration value becomes the measurement standard when image portions (linear portions) of the lithographic plate 21 are measured. By the measurement of each image area by each of the photosensors 117 of each of light-tight boxes 116, the image area rate of the slit-exposed panel detection region A is measured.

The detection region A at the lithographic plate 21 is moved relative to the lithographic plate 21 by the movement of the lithographic plate 21. As described above, it is possible to detect the region on the lithographic plate which is now facing the detection head 101, according to the edge detection device 102 and the encoder 104 provided at the carrying apparatus 100. Thereby, the image area rate at each of the predetermined regions a–e of the lithographic plate 21 is measured. The measurement of image area rates may also be performed by keeping the lithographic plate 21 under a halting state, and moving the detection head 101 in parallel along the detection surface of the lithographic plate 21.

Figure 4:
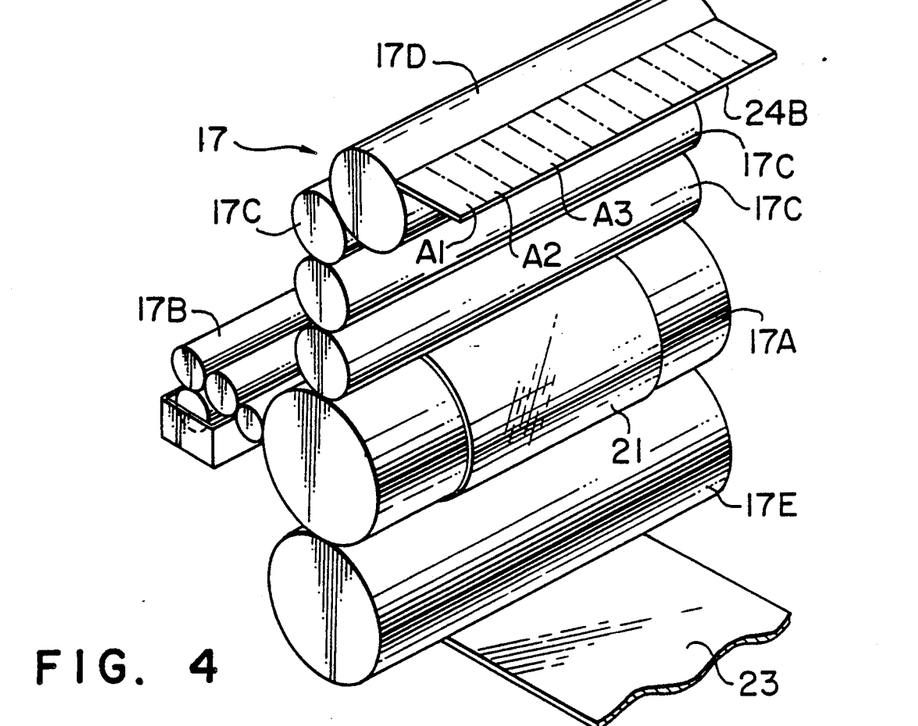
FIG. 4 is a model drawing showing a printing press.

The printing press 17 mounts the lithographic plate 21 on a plate roller 17A, as shown in FIG. 4, supplies water to portions other than image portions of the lithographic plate 21 by a wetting water roller 17B rotating in contact with the plate roller 17A, and performs printing supplying ink to image portions of the lithographic plate 21 by an ink source roller 17D rotating with the plate roller 17A via kneading rollers 17C. The ink supplied to image portions of the lithographic plate 21 mounted on the plate roller 17A is transferred to a printing paper 23 via a blanket drum (a rubber roller) 17E.

The printing press 17 comprises an ink supply amount adjusting apparatus 24. The ink supply amount adjusting apparatus 24 adjusts an ink supply amount for each of regions a–e (a region corresponding to at least a part of each of ink zones A1, A2, A3 —of the ink source roller 17D) of the lithographic plate 21, in accordance with the image area rate at each region.

Figure 5:
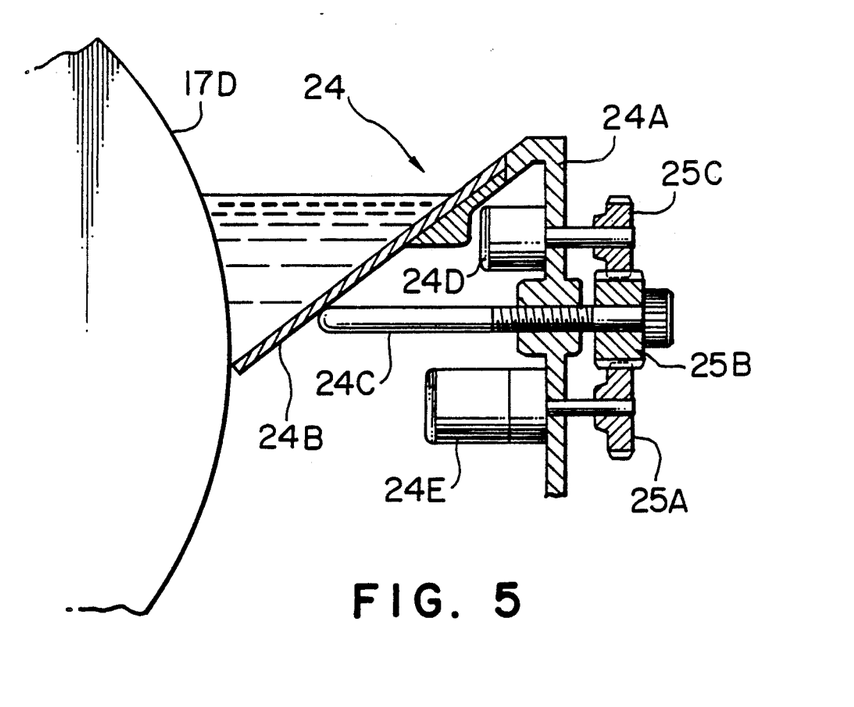
FIG. 5 is a model drawing showing an ink supply amount adjusting apparatus of the printing press.

That is, the ink supply amount adjusting apparatus 24 comprises, as shown in FIG. 5, a flat ink blade 24B held by a housing 24A continuously in the longitudinal direction of the ink source roller 17D, plural ink adjusting members 24C (ink adjusting screws) each of which is provided corresponding to each of ink zones A1, A2, A3, —partitioned in the longitudinal direction of the ink source roller 17D, and adjusts an ink supply amount of each ink zone adjusting the degree of advance and retreat of the ink blade 24B relative to each ink zone of the ink source roller 17D, a potentiometer 24D for detecting the actual setting amount of the ink adjusting member 24C (that is, the actual amount of the ink supply gap between the ink source roller 17D and the ink blade 24B), and an ink adjusting member driving motor 24E for driving each of the ink adjusting members 24C. The rotation of the ink adjusting member driving motor 24E is transmitted to the potentiometer 24D via gears 25A, 25B and 25C.

The control apparatus 18 converts the measured result by the image area rate measuring apparatus 15 into a motor driving amount for each ink zone using a predetermined conversion coefficient, and performs driving control of the ink adjusting member driving motor 24E corresponding to each ink zone. The detected amount by the potentiometer 24D is feedback to the control apparatus 18 at any time, and the ink adjusting member driving motor 24E is stopped when the gap between the ink source roller 17D and the ink blade 24B at each ink zone becomes under a state corresponding to the measured result of the image area rate measuring apparatus 15.

In the printing system 10, as shown in FIG. 2, the lithographic plate 21 which has been developed and fixed in the developing apparatus 14 is automatically carried from the developing apparatus 14 to the image area rate measuring apparatus 15 by carrying rollers 26 and the suction belt 100A. In the example of FIG. 1, the image area rate measuring apparatus 15 is unified to the exit portion of the lithography plate of the developing apparatus 14. It may also be configured that the developing apparatus 14 and the image area rate measuring apparatus 15 are provided separately from each other, and the lithographic plate 21 is linked by a belt conveyer or the like which performs automatic carriage.

As described above, the image area rate measuring apparatus 15 measures image area rates of the lithographic plate 21 by the optical detection head 101, and also detects the identification mark 22 attached on the lithographic plate 21 by the printing apparatus 13 by the mark reader 103. The identification mark 22 may not be attached by the printing apparatus 13, but may be attached by an inking device or a stamping device provided in the image area rate measuring apparatus 15.

The identification mark may be provided by photographic printing, by sticking a previously-prepared seal or tape on the lithographic plate, or by directly printing or stamping on the lithographic plate.

Image area rates of the lithographic plate 21 measured by the image area rate measuring apparatus 15 are recorded in the storage device 16 together with the identification mark 22 read by the mark reader 103.

On the other hand, a mark reader 27 is provided in each printing press 17, and the identification mark 22 of the lithographic plate 21 mounted on the plate roller 17A of the printing press 17 is read by the mark reader 27. The read result of the mark reader 27 is transferred to the control apparatus 18.

The control apparatus 18 receives the image area rates of the lithographic plate 21 corresponding to the identification mark 22 from the storage device 16 based on the identification mark 22 read by the mark reader 27, and controls the ink supply amount adjusting apparatus 24 of the printing press 17 based on the received result as described above.

Printing operation by the printing system 10 will be hereinafter explained.

(1) The printing apparatus 13 prints the image of the original picture film 20 on the lithographic plate 21, and also prints its identification mark 22 on the lithographic plate 21.

(2) The lithographic plate 21 which has been developed and fixed in the developing apparatus 14 is automatically carried from the developing apparatus 14 to the image area rate measuring apparatus 15 by the carrying rollers 26 and the suction belt 100A, and image area rates of the lithographic plate 21 are measured by the image area rate measuring apparatus 15. At this time, the identification mark 22 of the lithographic plate 21 is also read.

(3) The image area rates and identification mark of the lithographic plate 21 which are made in a pair are recorded and stored in the storage device 16 for every new lithographic plate 21.

(4) The lithographic plate 21 is sent from the plate making room 11 to the printing factory 12, and mounted on the plate roller 17A of the printing press 17.

(5) The mark reader 27 of each printing press 17 reads the identification mark 22 of the lithographic plate 21 mounted on the printing press 17, and the control apparatus 18 requests the measured data of the image area rates of the lithographic plate 21 corresponding to the identification mark 22 from the storage device 16.

(6) The storage device 16 transmits the measured data of the image area rates of the lithographic plate 21 corresponding to the identification mark 22 assigned by the control apparatus 18 to the control apparatus 18.

(7) The control apparatus 18 receives the transmitted data from the storage device 16 and controls the ink supply amount adjusting apparatus 24 of the printing press 17 according to the received result. The printing press 17 then performs printing.

Now, functions of the above-described embodiment will be explained.

In the above-described embodiment, the measured data of image area rates of the lithographic plate 21 by the image area rate measuring apparatus 15 are stored in the storage device 16 together with the identification mark 22. By reading the identification mark 22 of the lithographic plate 21 mounted on the printing press 17 by the mark reader 27, the control apparatus 18 draws the image area rates of the lithographic plate 21 having the concerned identification mark 22 from the storage device 16 and controls the ink supply amount adjusting apparatus 24 of the printing press 17, whereby the printing press 17 performs printing.

That is, in the above-described embodiment, the measured data of the image area rate measuring apparatus 15 installed in the plate making room 11 are online-transferred to the control apparatus 18 installed in the printing factory 12. Hence, it is not necessary to temporarily keep the storage medium of the measured data before inputting in the control apparatus 18, or carry the storage medium by manual operation of the operator or the like. Furthermore, since the identification mark 22 is attached to the lithographic plate 21, image area rates of which are to be measured, and the measured data and the identification mark are recorded in a pair in the recording device 16, it is possible to reliably and easily link the lithographic plate 21 with the corresponding measured data by the identification mark 22, and thus handling of the lithographic plate 21 and the measured data becomes excellent.

Furthermore, in the above-described embodiment, the developed lithographic plate 21 is automatically carried to the image area rate measuring apparatus 15 by the carrying rollers 26 and the suction belt 100A, and image area rates are measured in the image area rate measuring apparatus 15.

That is, in the above-described embodiment, it is not necessary to temporarily keep or carry by manual operation of the operator or the like the lithographic plate 21 between the developing apparatus 14 and the image area rate measuring apparatus 15.

Consequently, according to the above-described embodiment, it is possible to attempt the simplification and speedup of the lithographic plate processing line in the printing system 10, and improve the production efficiency thereof.

As described above, it is possible to completely automatize the printing system, by arranging so that the identification mark attached to the lithographic plate is read by the mark reader provided at the printing press, as in the above-described embodiment. However, the gist of the present invention is in that image area rates of the lithographic plate are stored in the storage device making the image area rates of the lithographic plate correspond to the identification mark attached to the lithographic plate. Accordingly, in execution of the present invention, the identification mark of the lithographic plate mounted in the printing press may also be read by the operator of the printing press, and the image area rates corresponding to the identification mark may be called from the storage device by an instruction of the operator, such as a manual input or the like, to the control apparatus. When the identification mark is a bar code, a portable bar-code reader may be manually operated by the operator, and the read signal of the bar-code reader may be transferred to and input in the control apparatus.

Furthermore, in the execution of the present invention, the identification mark attached to the lithographic plate may also be the number of the printing press and the number of a unit in the printing press. For example, in the case of a multicolor printing press consisting of four colors (yellow, magenta, cyan and black), four units each constituted by an identical mechanism comprising a plate roller, an ink source roller, an ink supply amount adjusting apparatus and the like are required. Four lithographic plates are also necessary, each of which is used for each color. Accordingly, when image area rates of a certain lithographic plate are stored in the storage device, the number of the printing press attached to the lithographic plate and the number of a unit of the printing press to which the lithographic plate is to be mounted are stored as the identification mark corresponding to the lithographic plate. Thus, by watching the numbers of the printing press and the unit attached to the lithographic plate, the printing press and the unit in the printing press to which the lithographic plate is to be mounted are simply and clearly determined. Furthermore, according to the numbers of the printing press and the unit attached to the lithographic plate mounted in the unit in the printing press, the control apparatus calls the image area rates corresponding to these numbers from the storage device, and the ink supply amount adjusting apparatus is operated according to the called data.

In a printing press in which the number of a unit uniquely corresponds to a certain color name, the color name may also be used as the identification mark to be attached to the lithographic plate instead of the number of the unit. In the preceding example, an explanation has been provided only about a multicolor printing press. However, in the case of performing printing of, for example, only one color by one printing press (four printing presses are required for four-color printing), it suffices that only the number of the printing press is attached to the lithographic plate as the identification mark, and image area rates of the lithographic plate are also stored in the storage device corresponding to the number of the printing press (in this case, it is not necessary to attach the number of the unit to the lithographic plate, since there is no unit). That is, the handling property of the lithographic plate in the printing system can be improved, if only a function capable of identifying (which unit of) which printing press the lithographic plate is to be mounted in, not merely capable of discriminating the lithographic plate from other lithographic plates, is provided.

Each of the above-described number of the printing press, the number of the unit, and the color name to be attached to the lithographic plate as the identification mark may consist of a code such as a bar code or the like, or the number itself and the color name itself.

Moreover, in execution of the present invention, it is useful to store in the image area rate measuring apparatus or the storage device connected thereto the following data a–g (refer to FIG. 7) which are inherent for each printing press.

a—number of printing press.

b—effect size (effective image region length (length of image area rate measurement range) in the up and down direction of the lithographic plate (the direction corresponding to the circumference direction of the plate roller)).

c—void size (interval from the lower edge of the lithographic plate to the effective image region).

d—detecting point (interval from the front edge to the effective image region in the right and left direction of the lithographic plate (moving direction toward the image area rate measuring apparatus).

e—total length (total length in the right and left direction of the lithographic plate).

f—key pitch (width of each ink zone of the ink supply amount adjusting apparatus).

g—key number (number of ink zones in use in the ink supply amount adjusting apparatus).

That is, in the printing system, for each printing press, the above-described data b–e, f and g are fixed values (in one printing press including plural units, the structure of each unit is, usually mutually identical, and so the above-described data a–g for each unit are identical).

Now, when the above-described data a–g have previously been recorded in the image area rate measuring apparatus of the storage device connected thereto, the image area rate measuring apparatus detects the front edge in the moving direction of the lithographic plate by the edge detection device, then reads the number of the printing press attached to the lithographic plate, and further calls the above-described data b–g corresponding to the number of the printing press which has been read, determines the effective image region, that is, measurement range of the lithographic plate according to the called data b–g, and selects, as a result, a photosensor to be used in the image area rate measuring apparatus. Thus, operation processing of the image area rate of each region (a–e) corresponding to each ink zone (A1, A2, A3, —) of the ink supply amount adjusting apparatus in the effective image region can be performed, respectively. Accordingly, it becomes unnecessary for the operator to manually input the above-described data b–g relative to the lithographic plate to be measured, and measurement and calculation operations can be promptly executed without loss.

In execution of the present invention, the number of a job to which the lithographic plate belongs may be attached to the lithographic plate, and the above-described data and the job number may be stored in the image area rate measuring apparatus or the storage device connected thereto.

Although, in the embodiment of the present invention, the lithographic plate is automatically carried to the image area rate measuring apparatus by the carrying apparatus after the developing apparatus in which development and fixation has been performed, and image area rates are then measured, the lithographic plate may also be automatically carried after an apparatus for burning or rubberization which is a process other than development in the lithographic plate production process, and image area rates may then be measured.

Figure 6:
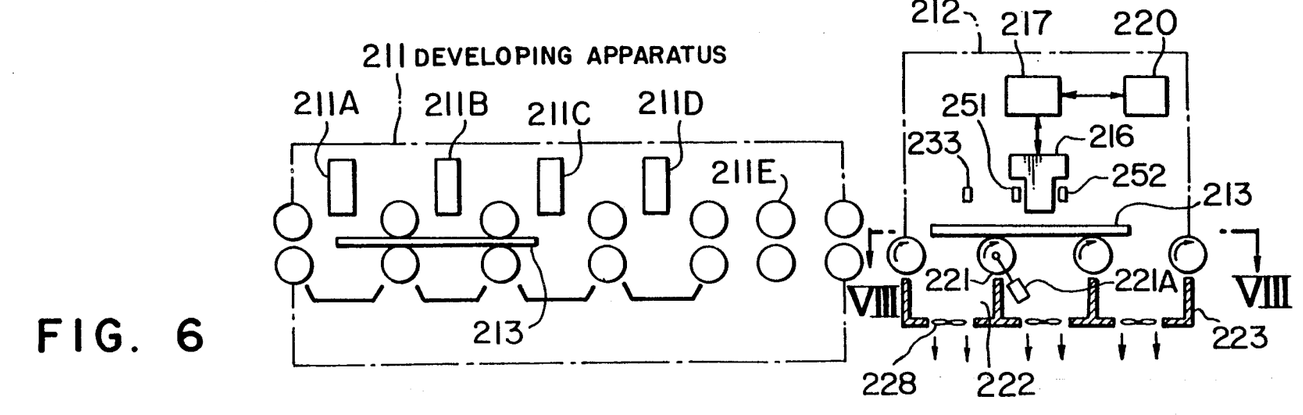
FIG. 6 is a model drawing showing an image area rate measuring system of a lithographic plate to which the present invention is applied.

In FIGS. 6 and 7, there are shown a developing apparatus 211 and an image area rate measuring apparatus 212.

Figure 7A:
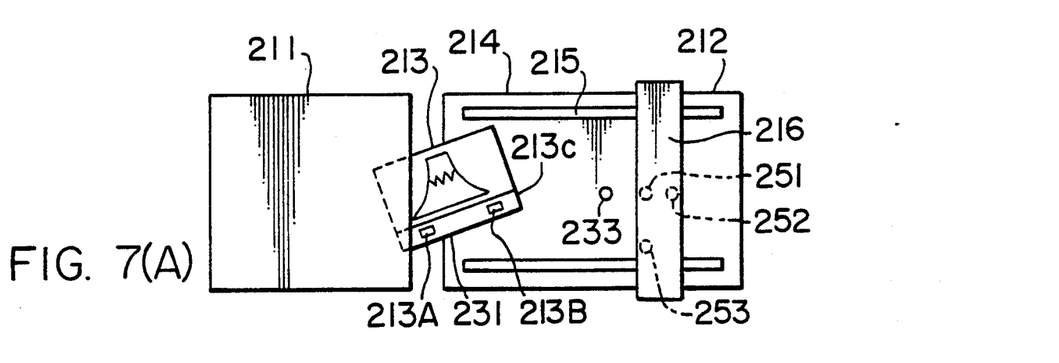
FIG. 7A shows a first operational state of the image area rate measuring system.

The developing apparatus 211 develops and fixes a lithographic plate 213 on which an image of an original picture film has been printed. In FIG. 6, there are shown a developer supply nozzle 211A, a washing nozzle 211B, a fixer supply nozzle 211C, a washing nozzle 211D and a drying roller 211E. A calibration mark 213A and an identification mark 213B such as a bar code or the like which are used when image area rates are measured are attached to a subzone 213C of the lithographic plate 213, as shown in FIG. 7A.

The image area rate measuring apparatus 212 comprises a lithographic plate carrying apparatus 214, a lithographic plate setting pusher 215, a detection head 217 and a control apparatus 216 for performing driving control of the lithographic plate carrying apparatus 214, the lithographic plate setting pusher 215 and the detection head 216. The detection head 216 is disposed to have a specific positioned relationship with the lithographic plate carrying apparatus 214, and measures image area rates of the lithographic plate 213 ubile being supported by the lithographic plate carrying apparatus 214.

Figure 8:
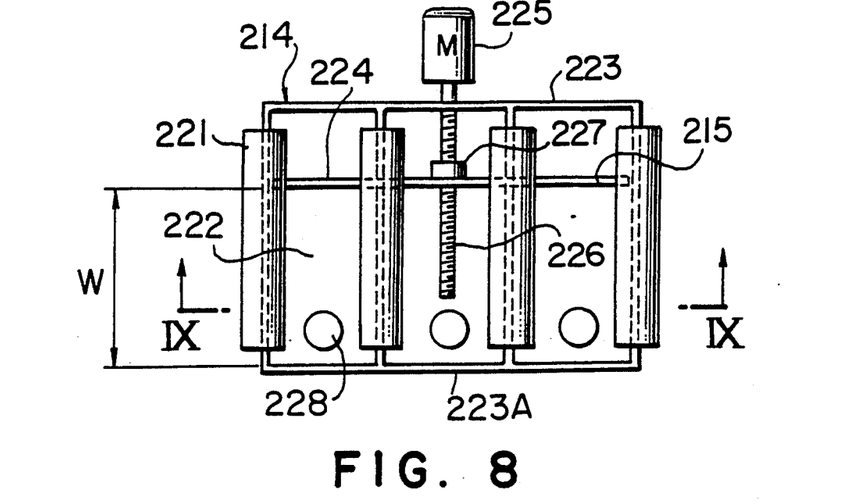
FIG. 8 is a cross-sectional view taken along line VIII—VIII in FIG. 6.
Figure 9:
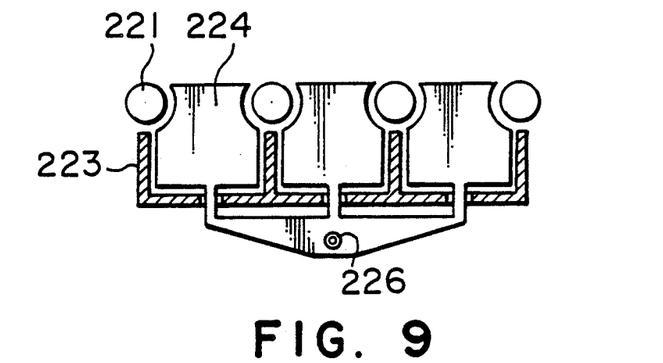
FIG. 9 is a cross-sectional view taken along line IX—IX in FIG. 8.

The lithographic plate carrying apparatus 214 mounts, supports and carries the lithographic plate 213 on plural mutually-juxtaposed rotating rollers 221 (rotating carrying means), as shown in FIGS. 6, 8 and 9. In FIG. 6, there are shown a roller driving control unit 220 and an encoder 221A.

At this time, the lithographic plate carrying apparatus 214 provides air rooms 222 which are nearly closed except a region of a lithographic plate carrying surface formed by the rotating rollers 221 at lower outside portions of the lithographic plate carrying surface. The air room 222 is provided for every adjacent two rotating rollers 221. Hence, the carrying apparatus 214 is provided with the plural adjacent air rooms 222. Each of the air rooms 222 is formed partitioned by a fixed wall 223 and a movable wall 224. The movable wall 224 is common to all the air rooms 222, and can be moved in a direction perpendicular to the lithographic plate carrying direction by a feed screw 226 driven by a motor 225 so that an interval W between the movable wall 224 and a fixed wall 223A facing it is adapted to the width of the lithographic plate 213 to be carried. There is also shown a nut 227. The lithographic plate carrying apparatus 214 also includes an exhaust fan 228 (atmospheric pressure adjusting means) at a base portion of each of the air rooms 222. The exhaust fans 228 adjust the internal atmospheric pressure of the air rooms 222 so that an atmospheric pressure acted upon a surface at the side opposite to the rotating rollers 221 becomes larger than an atmospheric pressure acted upon a surface at the side of the rotating rollers 221, while carrying the lithographic plate 213. The lithographic plate carrying apparatus 214 thereby presses the lithographic plate 213 against the side of the rotating rollers 221, by a difference between atmospheric pressures acted upon the surface at the side opposite to the rotating rollers 221 and a surface at the side of the rotating rollers 221. As a result, the contact resistance between the lithographic plate 213 and the rotating rollers 221 is increased, and it becomes possible to reliably carry the lithographic plate 213 without slip.

The lithographic plate setting pusher 215 is provided unified with the movable wall 224 of the lithographic plate carrying apparatus 214, and moves relatively to the fixed wall 223A facing the movable wall 224 in accordance with the width of the lithographic plate 213 to be carried. The lithographic plate setting pusher 215 thereby pushes a locating standard surface 231 (locating standard member) of the lithographic plate 213 at a standard setting bar 232 (standard setting member) predetermined at a supporting region of the lithographic plate carrying apparatus 214 so that the locating standard surface 231 coincides with the standard setting surface of the standard setting bar 232.

The control apparatus 217 controls the above-described each operation of the lithographic plate carrying apparatus 214 and the lithographic plate setting pusher 215, and starts the detection operation of image area rates by the detection head 216, on condition that the lithographic plate setting pusher 215 coincides with the locating standard surface 231 of the lithographic plate 213 with the standard setting surface provided at the standard setting bar 232 of the lithographic plate carrying apparatus 214 as described above.

That is, locating and detection operations of the lithographic plate 213 by the control apparatus 217 are performed as follows.

(1) The lithographic plate 213 sent from the developing apparatus 211 is received in the lithographic plate carrying apparatus 214 (refer to FIG. 7(A)).

Figure 7B:
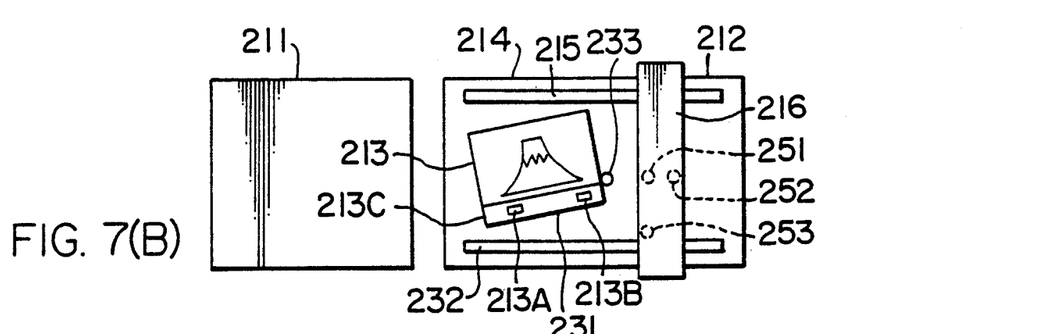
FIG. 7B shows a second operational state of the image area rate measuring system.

(2) The lithographic plate 213 is sent to and stopped at the position of a locating sensor 233 by the lithographic plate carrying apparatus 214 (refer to FIG. 7(B)).

Figure 7C:
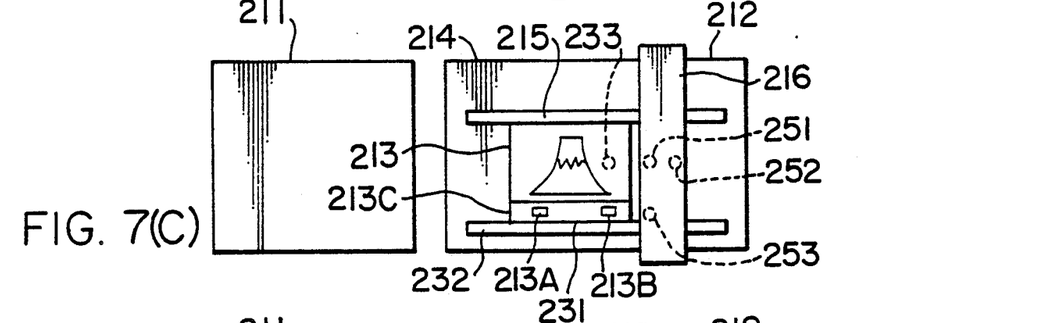
FIG. 7C shows a third operational state of the image area rate measuring system.
Figure 7D:
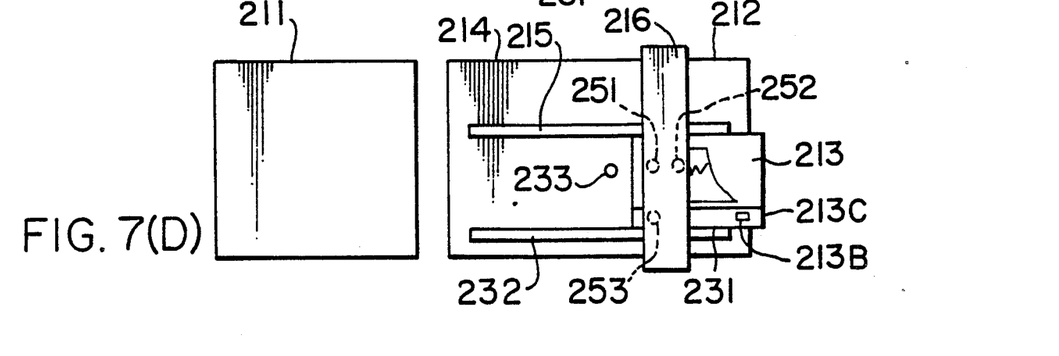
FIG. 7D shows a fourth operational state of the image area rate measuring system.

(3) The lithographic plate 213 is pushed up to the standard setting bar 232 by the lithographic plate setting pusher 215, and the locating standard surface 231 of the lithographic plate 213 is stopped at a position close to the standard setting surface of the standard setting bar 232 (refer to FIG. 7(C)). The lithographic plate is thereby located at a specific position of the carrying apparatus 214, accordingly, to a position having a specific relationship relative to the detection head 216.

(4) The lithographic plate 213 is moved again by the lithographic plate carrying apparatus 214, and sent to the detection region of the detection head 216. The detection head 216 then starts the detection of image area rates (refer to FIG. 7(D)).

Next, functions of the above-described embodiment will be explained.

According to the above-described embodiment, it is possible to reliably give a constant atmospheric pressure difference between an atmospheric pressure acted upon a surface at the side opposite to the rotating rollers 221 and an atmospheric pressure acted upon a surface at the side of the rotating rollers 221 of the lithographic plate 213, due to the presence of the air rooms 222 and the exhaust fans 228, and reliably press the lithographic plate 213 against the side of the rotating roller 221. The contact resistance between the lithographic plate 213 and the rotating rollers 221 is thereby increased, and it is possible to reliably carry the lithographic plate 213 without slip by contacting only one surface of the lithographic plate 213 with the rotating rollers 221.

Figure 10:
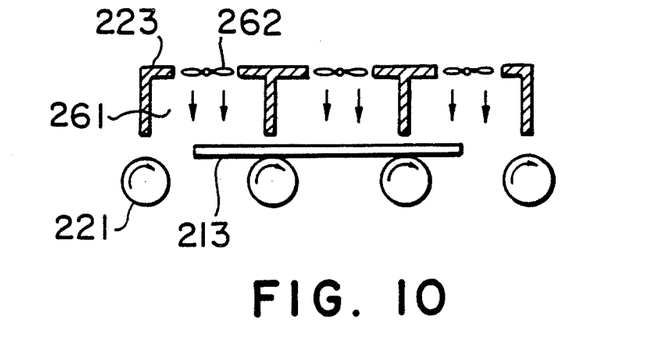
FIG. 10 is a model drawing showing another embodiment of the present invention.

FIG. 10 is a model drawing showing another embodiment of the present invention. This embodiment differs from the embodiment in FIG. 6 in that air rooms 261 are provided at upper outside portions of a lithographic plate carrying surface formed by the rotating rollers 221, and air inlet fans 262 are also provided at the air rooms 261. In this case too, the lithographic plate 213 is pressed against the side of the rotating rollers 221, the contact resistance between the lithographic plate 213 and the rotating rollers 221 is increased, and it is possible to reliably carry the lithographic plate 213 without slip by merely contacting only one surface of the lithographic plate 213 with the rotating rollers 221.

In execution of the present invention, air rooms having air inlet fans as shown in FIG. 10 may be provided at the side opposite to the rotating thin-plate carrying means, and air rooms having exhaust fans as shown in FIG. 1 may also be provided at the side of the rotating carrying means.

Furthermore, the pressure within the air rooms 222 may be reduced connected with a vacuum pump, or the air rooms 261 may be pressurized connected with a compressor, instead of providing exhaust fans 228 and air inlet fans 262.

In execution of the present invention, air rooms under a closed state are not necessarily provided.

Moreover, the present invention can be applied to a carrying apparatus in which relatively short belt conveyers are used as rotating carrying means, and a plurality of these short belt conveyers are juxtaposed.

What is claimed is:

1. A system for developing a lithographic plate and measuring image area rates of the lithographic plate, comprising:
   a developing apparatus for developing and fixing the lithographic plate on which an image of an original picture film and an identification mark have been printed, the identification mark having information including job number, color and printing press number;
   an image area rate measuring apparatus comprising a detecting head for optically detecting a surface of the lithographic plate on which the image has been printed, means for detecting edges of an image area of the lithographic plate, means for reading the identification mark, and an encoder for producing a signal which represents a change in position of the lithographic plate due to movement thereof so as to measure image area rates of the lithographic plate developed and fixed by the developing apparatus; and
   means for automatically transporting the lithographic plate from the developing apparatus to the image area rate measuring apparatus.

2. The system of claim 1, wherein the image area rate measuring apparatus measures image area rates of the lithographic plate during the course of movement of the lithographic plate.

3. The system of claim 1, wherein the identification mark is of a form selected from the group consisting of an image of photographic printing, previously prepared seal or tape, and a direct stamp.

4. The system of claim 1, wherein the image area rate measuring apparatus further comprises means for supporting and transporting the lithographic plate through the image area rate measuring apparatus, means for setting the lithographic plate so as to enable a locating standard member of the lithographic plate to coincide with a setting member fixed in a region of the supporting and transporting means, and control means for performing a driving control of the lithographic plate setting means and the supporting and transporting means, and initiating an image area rate detecting operation of said detecting head.

5. The system of claim 4, wherein the supporting and transporting means and automatic transporting means further comprise rotating rollers for transporting the lithographic plate, and air rooms disposed adjacent said rollers having means for adjusting the atmospheric pressure therein to thereby increase contact resistance between the lithographic plate and said rollers.

6. A printing system comprising:
   an image area rate measuring apparatus for optically detecting a surface of a lithographic plate on which an image of an original picture film and an identification mark have been printed, the identification mark having information including job number, color and printing press number, comprising means for detecting edges of an image area of the lithographic plate, means for reading the identification mark, and an encoder for producing a signal which represents a change in position of the lithographic plate due to movement thereof so as to measure image area rates of the lithographic plate;
   a printing press having a plate roller to which the lithographic plate is mounted after passing through the image area rate measuring apparatus, an ink source roller for supplying ink to image portions of the lithographic plate and an ink supply adjusting apparatus for adjusting an ink supply amount of ink zones partitioned on the ink source roller in a longitudinal direction thereof;
   a control apparatus for controlling the ink supply adjusting apparatus according to a measured result of the image area rate measuring apparatus; and
   a storage device for recording an image area rate identified by a corresponding job number;
   wherein the image area rate measuring apparatus measures image area rates of the lithographic plate and records the image area rates of the lithographic plate and the identification mark in the storage device, the control apparatus receives the identification mark from the reading means by the corresponding job number so as to identify the image area rates of the lithographic plate stored in the storage device and regulate the ink supply amount adjusting apparatus based on the image area rates.

7. The system of claim 6, wherein the identification mark is of a form selected from the group consisting of an image of photographic printing, previously prepared seal or tape, and a direct stamp.

8. The system of claim 6, wherein the image area rate measuring apparatus further comprises means for supporting and transporting the lithographic plate therethrough, means for setting the lithographic plate so as to enable a locating standard member of the lithographic plate to coincide with a setting member fixed in a region of the supporting and transporting means, and control means for performing a driving control of the lithographic plate setting means and the supporting and transporting means, and initiating an image area rate detecting operation of said detecting head.

9. The system of claim 8, wherein the supporting and transporting means and automatic transporting means further comprise rollers for transporting the lithographic plate, and air rooms disposed adjacent said rollers having means for adjusting the atmospheric pressure therein to thereby increase contact resistance between the lithographic plate and said rollers.

10. A printing system comprising:

a developing apparatus for developing and fixing a lithographic plate on which an image of an original picture film and an identification mark have been printed, the identification mark having information including job number, color and printing press number;

an image area rate measuring apparatus for optically detecting a surface of the lithographic plate on which the image and the identification mark have been printed, comprising means for detecting edges of an image area of the lithographic plate, means for reading the identification mark, and an encoder for producing a signal which represents a change in position of the lithographic plate due to movement thereof so as to measure image area rates of the lithographic plate developed by the developing apparatus;

a printing press comprising a plate roller to which the lithographic plate is mounted after passing through the image area rate measuring apparatus, an ink source roller for supplying ink to image portions of the lithographic plate and an ink supply adjusting apparatus for adjusting an ink supply amount of ink zones partitioned on the ink source roller in a longitudinal direction thereof;

a control apparatus for controlling the ink supply adjusting apparatus according to a measured result of the image area rate measuring apparatus;

a storage device for recording an image area rate identified by a corresponding job number; and means for automatically transporting the lithographic plate from the developing apparatus to the image area rate measuring apparatus;

wherein the image area rate measuring apparatus measures image area rates of the lithographic plate and records the image area rates and the identification mark of the lithographic plate in the storage device, the control apparatus receives the identification mark from the reading means by the corresponding job number so as to identify the image area rates of the lithographic plate stored in the storage device and regulate the ink supply adjusting apparatus of the printing press based on the image area rates.

11. The system of claim 10, wherein the identification mark is of a form selected from the group consisting of an image of photographic printing, previously prepared seal or tape, and a direct stamp.

12. The system of claim 10, wherein the image area rate measuring apparatus further comprises means for supporting and transporting the lithographic plate therethrough, means for setting the lithographic plate so as to enable a locating standard member of the lithographic plate to coincide with a setting member fixed in a region of the supporting and transporting means, and control means for performing a driving control of the lithographic plate setting means and the supporting and transporting means, and initiating an image area rate detecting operation of said detecting head.

13. The system of claim 12, wherein the supporting and transporting means and automatic transporting means further comprises rollers for transporting the lithographic plate, and air rooms disposed adjacent said rollers having means for adjusting the atmospheric pressure therein to thereby increase contact resistance between the lithographic plate and said rollers.

* * * * *